(12) United States Patent
Lal et al.

(10) Patent No.: US 6,479,920 B1
(45) Date of Patent: Nov. 12, 2002

(54) DIRECT CHARGE RADIOISOTOPE ACTIVATION AND POWER GENERATION

(75) Inventors: Amit Lal, Madison, WI (US); Hui Li, Madison, WI (US); James P. Blanchard, Madison, WI (US); Douglass L. Henderson, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 09/832,342

(22) Filed: Apr. 9, 2001

(51) Int. Cl.[7] .............................. H02N 1/00; H02N 2/18; H01L 41/08
(52) U.S. Cl. .................... 310/309; 310/339; 376/320
(58) Field of Search ................................ 310/302, 305, 310/309, 339; 376/320

(56) References Cited

U.S. PATENT DOCUMENTS

| | | | |
|---|---|---|---|
| 4,835,433 A | 5/1989 | Brown | 310/305 |
| 5,079,469 A | * 1/1992 | Bongianni | 136/202 |
| 5,280,213 A | 1/1994 | Day | 310/302 |
| 5,440,187 A | 8/1995 | Little et al. | 310/303 |
| 5,590,162 A | 12/1996 | Terhune et al. | 376/320 |
| 5,606,213 A | 2/1997 | Kherani et al. | 310/303 |
| 5,608,767 A | 3/1997 | Terhune et al. | 376/321 |
| 5,642,014 A | 6/1997 | Hillenius | 310/303 |
| 5,721,462 A | 2/1998 | Shanks | 310/303 |
| 5,825,839 A | 10/1998 | Baskis | 376/320 |
| 5,859,484 A | 1/1999 | Mannik et al. | 310/303 |
| 5,945,767 A | * 8/1999 | Westlund | 136/201 |
| 6,103,295 A | 8/2000 | Chan et al. | 427/5 |
| 6,297,579 B1 | * 10/2001 | Martin et al. | 310/330 |

* cited by examiner

Primary Examiner—Thomas M. Dougherty
(74) Attorney, Agent, or Firm—Foley & Lardner

(57) ABSTRACT

An activator has a base on which is mounted an elastically deformable micromechanical element that has a section that is free to be displaced toward the base. An absorber of radioactively emitted particles is formed on the base or the displaceable section of the deformable element and a source is formed on the other of the displaceable section or the base facing the absorber across a small gap. The radioactive source emits charged particles such as electrons, resulting in a buildup of charge on the absorber, drawing the absorber and source together and storing mechanical energy as the deformable element is bent. When the force between the absorber and the source is sufficient to bring the absorber into effective electrical contact with the source, discharge of the charge between the source and absorber allows the deformable element to spring back, releasing the mechanical energy stored in the element. An electrical generator such as a piezoelectric transducer may be secured to the deformable element to convert the released mechanical energy to electrical energy that can be used to provide power to electronic circuits.

36 Claims, 7 Drawing Sheets

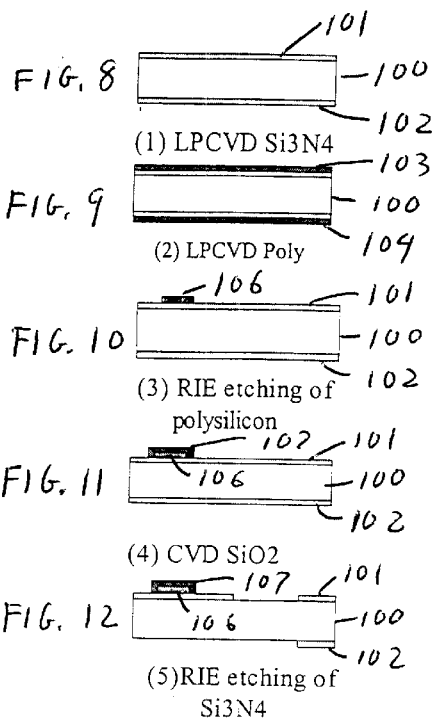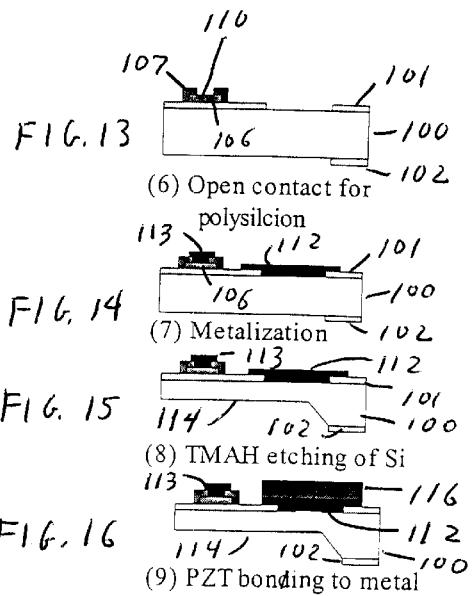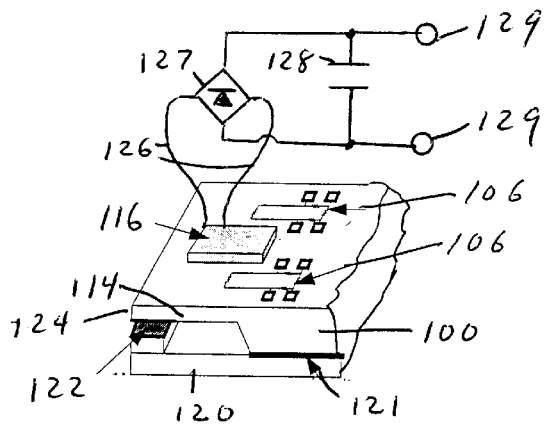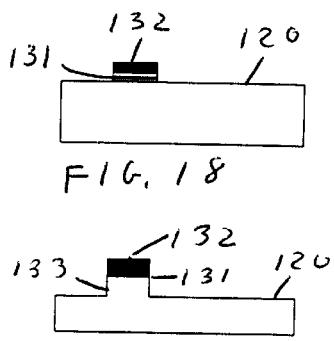

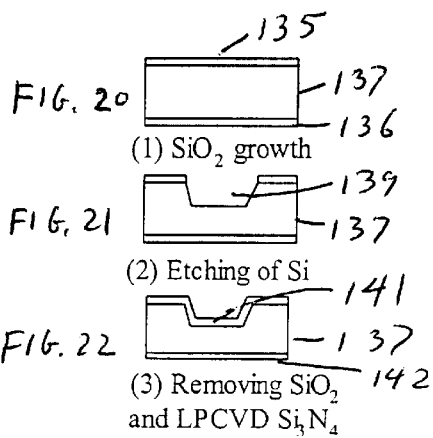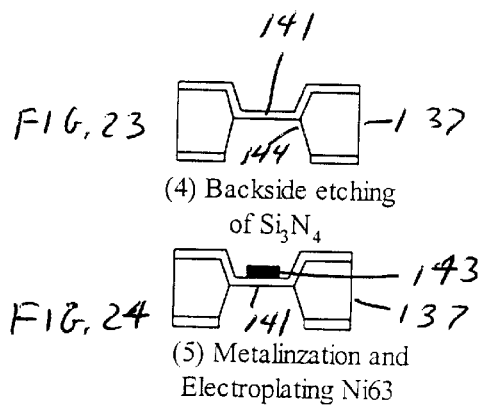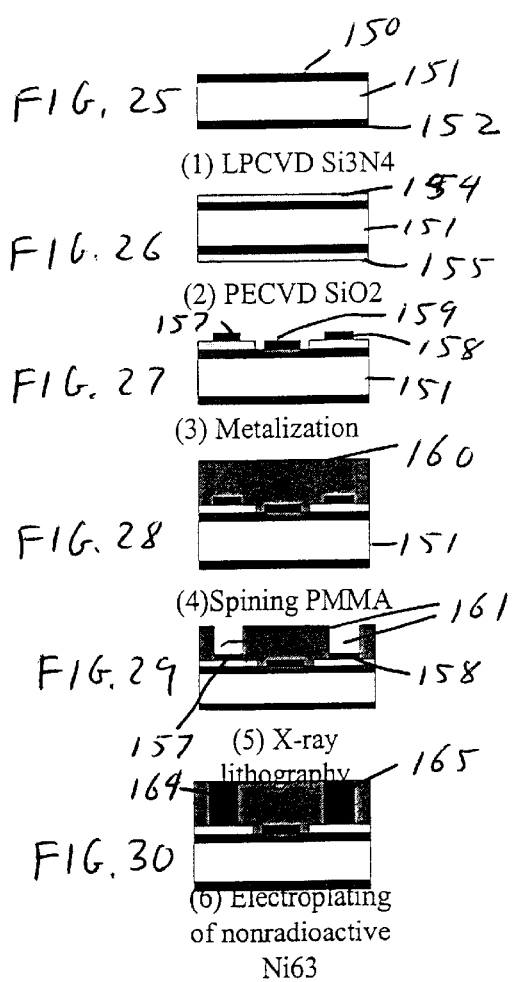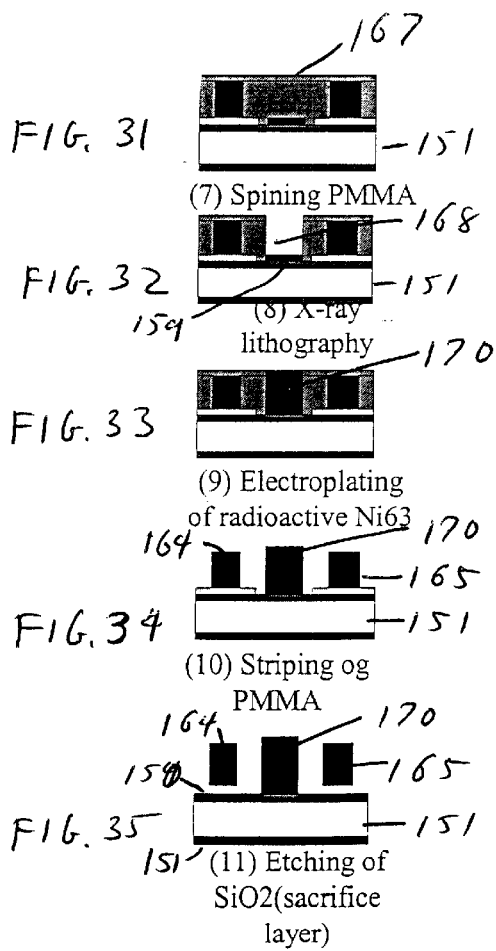

DIRECT CHARGE RADIOISOTOPE ACTIVATION AND POWER GENERATION

REFERENCE TO GOVERNMENT RIGHTS

This invention was made with United States government support awarded by the following agency: DOE DE-FG07-991 D13781. The United States government has certain rights in this invention.

FIELD OF THE INVENTION

This invention pertains generally to the field of radioactive power sources and to micromechanical and microelectromechanical devices.

BACKGROUND OF THE INVENTION

Manufacturing techniques have been developed for the production of microelectromechanical systems (MEMS) using manufacturing technologies adapted from the manufacturing of integrated circuits and other electronic devices. Such MEMS structures may be formed of a variety of materials, including semiconductors used in integrated circuit manufacturing, such as silicon, and various metals. The small size of MEMS systems and the materials of which they are formed naturally offers the opportunity for the integration of these structures with integrated circuits to provide totally autonomous Microsystems. However, such systems still require a power source, and the utility of autonomous Microsystems has been hindered by the unavailability of suitable power sources. Even the smallest conventional batteries may be much larger than the MEMS system being supplied with power, thus limiting the extent to which the size of the overall device can be shrunk. In addition, conventional batteries have a relatively short useful lifetime, typically on the order of days to weeks or at most months, whereas in some applications it would be desirable to have a power source capable of supplying power to the MEMS device for many months or even years. Suitable devices with sufficient lifetime would be useful for a variety of applications. For example, sensor systems placed over a large area may be utilized to monitor vibration and gas output of vehicles and report back the information to a central collection point via optical or radio frequency (RF) communications. The signals produced by the small autonomous sensors may be picked up and stored and amplified by a larger central system powered by conventional sources such as gasoline engines, fuel cells, or large batteries. Such sensors have also been proposed for use in battlefield monitoring and in commercial applications for sensing properties that affect component life such as viscosity, Young's modulus, vibration, etc. If such devices could be provided with power sources capable for operating for years or decades without replacement, the sensors could be embedded inside permanent casings such as walls of buildings, or could be utilized in space research as "microsatellites."

One proposed approach to providing long-lived power sources is the use of radioisotopes that generate electrical power in a nuclear "battery." Early approaches to such batteries are discussed in A. Thomas, "Nuclear Batteries: Types and Possible Uses," Nucleonics, Vol. 13, No. 11, November 1955. One approach to electric power generation from radioisotopes is based on charge particle collection. See, e.g., G. H. Miley, "Direct Conversion of Nuclear Radiation Energy," American Nuclear Society, 1970; L. C. Olsen, et al., "Betavoltaic Nuclear Electric Power Sources," Winter Meeting of the American Nuclear Society, San Francisco, Calif., 1969. Most of the nuclear battery designs are based on thermal effects, in which a volume of the source is self-heated due to highly energetic particle impacts, and the heat energy is then converted to electrical energy, with a typical efficiency of 4% to 15% (a quantity determined by the efficiency of the thermo-electric converter). Although such an approach is amenable to miniaturization, the need for thermal isolation and relatively high operating temperatures makes such devices suitable primarily where high power is required and where the high operating temperature and volume of heat produced is not problematic. Further, as devices shrink in size, the surface to volume ratio increases, with large losses from radiative and convective losses. In particular, the stopping depth for electrons or alpha particles in materials is usually in the range of a few microns to several tens of microns, indicating that the charged particle collector must be at least that many microns thick. This implies that the collector cannot be scaled down to a thickness less than the decay depth since otherwise the emitted particles simply pass through. Consequently, it is unlikely that traditional thermal conversion will work in microscale devices. Another approach for converting emitted charged particles to electric power is by the creation of electron-hole pairs by ionization in a semiconductor (e.g., silicon). In a depletion region electric field, the pairs can be separated to provide electric energy. This is essentially the same principle used in solar cells, where photons cause electron-hole pair generation. An advantage of the use of particles from nuclear decay is that they create thousands of electron-hole pairs per emitted particle because of the large particle energy. However, a significant disadvantage is that the high energy of the particles damages the crystal lattice, which in turn reduces the effectiveness of the capture of more particles. Although there are ways to continuously or intermittently thermally anneal the crystal, it is unlikely that such annealing will result in a fully repaired crystal and it is a process that is difficult to utilize in devices that are in place in the field. Furthermore, because such sources depend on the use of pn-junctions, the operating temperature range of the devices is limited to about $-15°$ C. to $100°$ C. Another approach is to generate light by the incidence of the emitted particles onto a luminescent material, and then capture the emitted light with a photocell to produce electricity. However, such an approach requires very high radioactive source levels due to the low efficiency of the incident particle to photon production.

Another approach which has been considered is the use of direct charge in which charged particles, e.g., electrons, emitted from a source are collected by a collector spaced by a gap from the source, thereby building up a potential difference between the source and the collector. By increasing the gap between the source and the collector, it is theoretically possible to obtain very high voltage differences (e.g., millions of volts) due to the low capacitance between the source and the collector, but any attempt to use the power from the system to drive even a picofarad (pF) load will effectively reduce that output voltage to millivolts. Consequently, such an approach would only provide useful output voltages if the load capacitance is of the same order of magnitude as that of the source-collector capacitor. For sources having relatively low radiation flux, as generally would be the case for devices to be used in the microsensor field, the voltages that could be obtained by this approach would necessarily be quite low.

SUMMARY OF THE INVENTION

The present invention carries out direct conversion of radioactive emissions to mechanical motion such as in micromachined elements. The motion of the micromachined elements may be utilized directly to actuate other mechanical parts or the motion of the mechanical elements may be converted to electrical energy to provide a long-lived source of electrical power for microelectromechanical systems. Such electrical power generators have a very high energy density as compared to conventional power sources for microsystems, such as batteries, can be designed to have extremely long life, in the range of several years, and can provide output voltages at levels suitable for driving conventional integrated circuit electronics.

An activator in accordance with the invention is formed with a base or substrate on which is mounted an elastically deformable element that has a section that is free to be displaced toward the base. The deformable element may be formed of various types of structures that may be produced by conventional machining or by micromechanical processing, including cantilevers, bridges and deformable membranes. An absorber of radioactively emitted particles (e.g., electrons) is formed on one of the base or the displaceable section of the deformable element, and a material comprising a radioactive source is formed on the other of the base or displaceable section, facing the absorber across a gap chosen to provide a selected efficiency of particle collection. The radioactive source emits charged particles, such as electrons or alpha particles, resulting in a buildup of opposite charges on the source and absorber, thereby producing an electrostatic force between these two elements and resulting in the section of the deformable element to which the source or absorber is attached being drawn toward the base to bend the deformable element. Mechanical energy is thus stored in the elastically deformable element which is released when the absorber is drawn into effective electrical contact with the source. The elastic return of the deformable element toward its initial position releases mechanical energy which can be used to activate other mechanical elements or to generate electrical power. In a preferred micromechanical power generator, an electrical generator is coupled to the deformable element, for example, a piezoelectric element mounted to the deformable element to deform with it. As the deformable element elastically springs back toward its initial position, strain on the piezoelectric transducer is also released, resulting in electrical power generated by the piezoelectric element that may be connected from its output terminals to a load, such as a radio frequency coil. The capacitance of the piezoelectric transducer element connected to the coil provides a resonant tank circuit that produces an electrical oscillation at a characteristic frequency which is excited by the pulse of output voltage from the piezoelectric transducer. This voltage may be rectified and stored on a storage capacitor for use by other electronic components, and the high frequency oscillation may also be utilized to provide a radio signal that can be detected by remote detectors.

A preferred micromechanical generator includes a cantilever beam mounted by a post at one end to extend out over a top surface of the base, the absorber or source being formed on the free end of the beam. The beam itself may be formed of various materials commonly utilized in micromechanical systems, including single crystal silicon and polysilicon, and metals such as nickel, gold and copper. The absorber is preferably formed of a material such as a metal which can readily absorb and retain the charge of the radiated particles without long-term damage or other effect. The radioactive material forming the source preferably emits primarily beta particles (electrons) and is selected to provide a desired balance between emission activity and safety. A particularly preferred radio isotope is nickel-63, which combines the characteristics of long life (half life of 100 years), pure beta particle emission, and moderate activity levels.

An electromagnetic generator of the invention may be utilized as a sensor to provide an output signal to a remote source indicative of the quantity being sensed. For example, a piezoresistor may be connected electrically between the absorber and the source to effectively control the rate at which the absorber charges to the point of contact between source and absorber, thereby varying the period of the cycle of charging and touchdown between the source and absorber in relation to the quantity being sensed.

Further objects features and advantages of the invention will be apparent from the following detailed description when taken in conjunction with the accompanying drawings.

BRIEF DESCRIPTION OF THE DRAWINGS

In the drawings:

FIGS. 8–16 are shematic views showing steps in an exemplary process for fabricating micromechanical power generating devices in accordance with the invention.

FIG. 17 is a simplified view illustrating the assembly of a piezoelectric transducer onto a silicon cantilever element in the formation of a micromechanical power generating device in accordance with the invention.

FIGS. 18 and 19 illustrate steps in the formation of the radioactive source on a glass substrate.

FIGS. 20–24 are simplified views illustrating the steps for the fabrication of an exemplary radioactive source on a silicon base substrate.

FIGS. 25–35 are simplified views illustrating the steps in an exemplary process for depositing radioactive nickel-63 on a substrate.

DETAILED DESCRIPTION OF THE INVENTION

In the present invention, the energy carried by particles emitted by radioactive decay in a radioisotope is captured and converted to mechanical potential energy that is stored in an elastically deformable element. The release of the energy stored in the deformable element can be utilized to activate other mechanical parts directly or can be converted to electrical energy that can be supplied to drive electronic components such as an integrated circuit. The conversion of the energy from the radioactive emissions directly to mechanical potential energy, then to electrical energy, can be carried out utilizing structures and materials which are not significantly affected over time by the radioactive emissions, in contrast to conventional pn-junction semiconductor devices which directly convert the energy of the radioactive emissions to electrical energy. Further, the power generating devices of the present invention do not require thermal insulation and do not need to operate at high internal temperatures, as do power generation devices depending on the conversion of the radioactive energy to heat energy which is converted to electrical energy, and the radioactive sources do not need to have the high intensity of emissions that are required to power generators based on conversion of radioactive emissions to fluorescent light emissions and thence to electrical energy by photocells. The power generating devices of the invention are capable of operating over a wide range of temperatures and over other extremes of environmental conditions.

Figure 1:
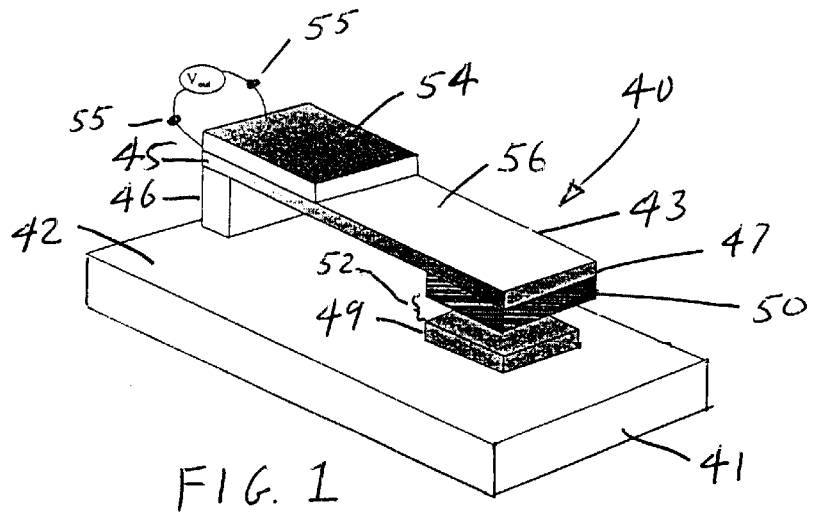
FIG. 1 is a simplified perspective view of a micromechanical power generator in accordance with the invention.

For purposes of illustrating the principles of the invention, a micromechanical activation device for electrical power generation is illustrated generally at 40 in FIG. 1. The device 40 includes a base or substrate 41 (which may be made of common materials used in micromechanical systems such as single crystal silicon, glass, etc.), having a top surface 42 on which is mounted an elastically deformable element 43 which, for the device 40 shown in FIG. 1, comprises an elongated cantilever beam having a fixed end 45 which is mounted to the base 41 by a mounting block 46, and a free end 47. A radioactive source 49 is mounted to the base under the free end 47, and an absorber 50 of radioactively emitted particles is mounted to the element 43 at its free end 47 facing the base 41 and the radioisotope source 49. Although the absorber 50 is shown mounted on the element 43 and the source 49 is shown on the base for purpose of illustrating the invention, it is understood that the absorber 50 may be on the base and the source 49 may be on the deformable element. The mounting block 46 suspends, the cantilever bridge element 43 over the top surface 42 of the base 41 and normally holds the bottom face of the absorber 50 spaced from the upper face of the radioactive source 49 by a gap 52. A piezoelectric element 54, having output terminals 55, is secured to the top surface 56 of the cantilever element 43 so that the piezoelectric plate 54 will flex and deform with the deformable cantilever 43. The radioisotope source 49 is preferably formed of a material that emits charged particles, preferably primarily electrons. The particles emitted by radioactive decay from the source 49 that impinge upon the absorber 50 are absorbed and retained by the material of the absorber, charging the absorber 50 negatively (where electrons are emitted by the source), whereas the source 49 retains a positive charge. The absorber 50 is preferably formed of a good conducting metal that will readily absorb the electrons impinging upon it, and it is preferably electrically insulated from the cantilever beam 43 or otherwise is electrically insulated so that a current cannot flow through the beam 43, the support 46, and the base 41 between the source 49 and the absorber 50. As charge builds up on the absorber 50 and the source 49, the electrostatic force between these elements increases, and bending the cantilever beam 43 so that the absorber 50 begins to approach the source 49, reducing the gap 52 between the source and the absorber. The force applied to the beam 43 to bend it downwardly stores mechanical potential energy in the beam 43. If the initial gap 52 is selected appropriately, after a specific length of time, the beam 43 will bend sufficiently that the absorber 50 makes an effective electrical contact with the source 49, thereby discharging the charge on these elements and releasing the beam 43, which resiliently returns toward its rest or normal position as it releases the potential energy stored in the bent beam, and in doing so releases the stress imposed on the piezoelectric plate 54 which generates a pulse of electrical power at the output terminals 55 of the piezoelectric element 54. As used herein, effective electrical contact includes not only physical contact, but sufficient proximity such that a current flows between the absorber and source to discharge the charge built up on these elements.

Figure 2:
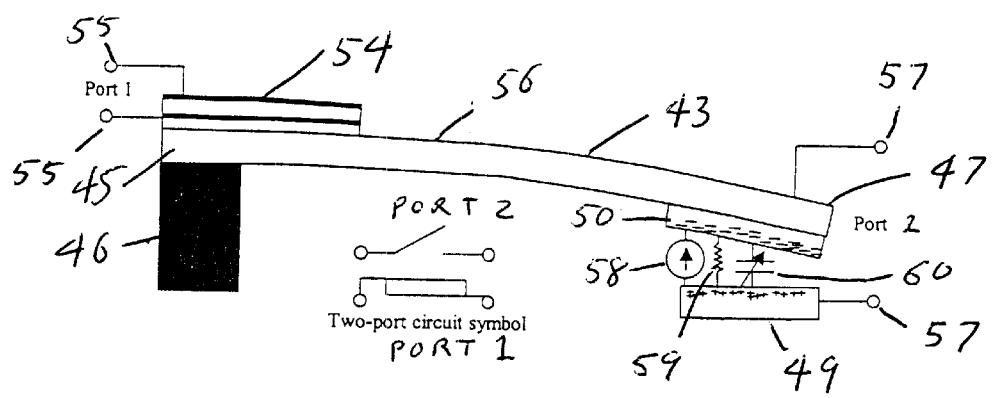
FIG. 2 is a simplified side view of the power generator of FIG. 1 with the equivalent circuit shown for purposes of illustration.

As illustrated in FIG. 2, an electrical model of the radioisotope source 49 and the absorber 50 as a circuit element between terminals 57 can be represented equivalently as a current source 58, a resistor 59, and a nonlinear capacitor 60. The current source 58 constitutes the emitted charges, the resistor 59 is due to ionization current of gas in the gap 52, and the nonlinear capacitor 60 corresponds to the capacitance between the source 49 and the absorber 50. The capacitance of the capacitor 60 changes as the beam 43 is bent and the absorber 50 approaches the source 49. The radioisotope source is modeled as a current source 58 as well as one of the electrodes of the capacitor 60 formed between the source and the cantilever. Since the cantilever keeps moving closer to the source, the capacitance varies with time. The resistance 59 is included to model the possible leakage path. Several mechanisms may contribute to this resistance. First, the ions in the gas between the electrodes may neutralize the charges on both the source and the cantilever. Second, the charged particles can ionize the gas molecules and the ions mobile in the presence of the electric field will result in a leakage current. Third, secondary electrons emitted from the cantilever due to high-energy charged particles may contribute to the leakage current. Charge conservation results in:

$$\frac{\alpha I}{A} - \frac{V}{RA} - \frac{\partial D}{\partial t} = 0 \qquad (1)$$

where I is the total emitted current from the radioisotope, A is the area of the capacitor, R is the equivalent resistance, V is the voltage across the source and the cantilever, D is the electric displacement, t is the time and α is an empirical coefficient describing the portion of the total current that gets collected by the cantilever. The reasons for not collecting all the emitted charges are: first, the charged particles emitted from the source have certain angular distribution and only the particles that fall in the solid angle formed by the intersection of the source and cantilever will be collected; second, some high energy particles can travel through the cantilever; third, when secondary electrons are emitted from the cantilever, positive charges will be left and they will affect the total amount of charges in the cantilever. The third term in Equation 1 is the displacement current of the capacitance. The angle of approach between the cantilever and the source is small leading to the approximation that an average gap d is between the cantilever and the source. Therefore, the electrical field between the source and the cantilever can be taken as uniform, which leads to:

$$D=\epsilon_0 V/d \qquad (2)$$

Substituting Equation 2 into Equation 1 results in:

$$\frac{\alpha I}{A} - \frac{V}{RA} - \varepsilon_0 \frac{\partial}{\partial t}\left(\frac{V}{d}\right) = 0 \qquad (3)$$

Assuming that the cantilever moves very slowly, an assumption which is verified by experiment, one can ignore the cantilever's inertia. In this quasi-static approximation, the electrostatic attraction force acting on the cantilever is exactly balanced by the spring force of the cantilever. This can be written as:

$$k(d_0-d)=QE \qquad (4)$$

where k is the spring constant, do is the initial distance, d is the distance at time t, Q is the total charges on the cantilever and E is the electric field. As discussed above, a uniform electric field is assumed ad this also leads to:

$$E=V/d \qquad (5)$$

By the same argument for the uniform electric field, the capacitor can be modeled as a parallel plate capacitor. So:

$$Q = CV = \frac{\varepsilon_0 AV}{d} \qquad (6)$$

Combining Equation 4, 5 and 6 together:

$$k(d_0 - d) = \varepsilon_0 A \frac{V^2}{d^2} \qquad (7)$$

which can be rewritten as:

$$V = d\sqrt{\frac{k}{\varepsilon_0 A}}\sqrt{d_0 - d} \qquad (8)$$

Plugging Equation 8 into Equation 3 results in:

$$\frac{\partial d}{\partial t} = \frac{2}{\varepsilon_0 RA}(d_0 - d)d - \frac{2\alpha I}{\sqrt{\varepsilon_0 k A}}\sqrt{d_0 - d} \qquad (9)$$

This equation can be readily solved numerically to compare with experimental results. At standard temperature and pressure, the collected charges can easily be neutralized by air molecules. This will reduce R to a small value, resulting in negligible and no movement as observed in experiments done in room air. Therefore, a large R is preferred, requiring vacuum operation. Under the experimental conditions where the pressure is between 25 mTorr, R was found to be on the order of $10^{14}$ to $10^{15}\Omega$. This result allows the elimination of R. Thus, Equation 9 becomes:

$$\frac{dd}{dt} = -2C_1\sqrt{d_0 - d} \qquad (10)$$

with $C_1=\alpha I/\sqrt{\epsilon_0 kA}$. A closed-form solution can be obtained:

$$d=-(C_1 t+C_2)^2+d_0 \qquad (11)$$

where $C_2$ is a constant. Including $C_2$ in the solution implies that at t=0, the cantilever may not be at its original position, which can be explained by residual charges on the cantilever and the source left by incomplete discharging. At t=0, Equation 11 leads to:

$$d_0-d=C_2^2 \qquad (12)$$

Denoting the residual charges as $Q_0$, with uniform electric field assumption results in:

$$E = \frac{Q_0}{\varepsilon_0 A} \qquad (13)$$

Combining Equation 4, 12 and 13:

$$Q_0=C_2\sqrt{\epsilon_0 kA} \qquad (14)$$

Therefore, $C_2$ can be used to calculate the amount of the residual charges on the cantilever. Once d(t) is determined, V(t), the voltage across the capacitor can be readily calculated by using Equation 8. Energy stored in the cantilever can be determined by:

$$E=E_M+E_E-1/2k(d_0-d)^{2}+1/2CV^2 \qquad (15)$$

where $E_M=k(d_0-d)^2/2$ is the mechanical energy and $E_E=CV^2/2$ is the electrical energy. This model can also be used to find the period of the movement, $T=(\sqrt{d_0}-C_2)/C_1$ given all the parameters.

For the cantilever device 40 of FIGS. 1 and 2, three potential operating regimes are possible. If the initial gap between the source and absorber is sufficiently large, the electrostatic force and the spring force essentially balance so that additional displacements of the cantilever beam toward the substrate as charge accumulates on the absorber becomes infinitesimally small, and contact between the absorber 50 and the source 49 never occurs. If the gap is relatively small, the electrostatic force increases faster than the spring force in the cantilever and at some point the beam catastrophically collapses—equivalent to the classical beam pull-in voltage. In a third regime, with an intermediate gap, the beam continues bending and the pull-in voltage which would result in collapse of the beam does not occur. Rather, the beam gradually continues to bend and the absorber continues to approach the source until the absorber touches the source (or tunneling leaks current through the gap) to release the charge and short circuit the voltage across the capacitor formed between the absorber and the source.

The device 40 is an example of an embodiment of the micromechanical activator and generator of the present invention in a cantilever beam 43. The present invention may also be implemented using other electrostatically deformable micromechanical structures such as bridges, in which the beam is mounted at both ends to the substrate and is free to flex downwardly toward a base or substrate at its middle, and deformable membranes which are secured by a mounting structure to a base at a periphery of the membrane and which are free to deflect elastically toward the base. In the case of a micromechanical bridge, the absorber 50 or source 49 would generally be formed at the middle of the bridge facing an adjacent radioisotope source on the base, and for a membrane, the absorber 50 or source 49 would generally be formed at the center of the membrane with the source located on the base adjacent to the absorber and spaced therefrom by a suitable gap. Piezoelectric transducer elements are appropriately secured to the surfaces of the bridge or membrane to be flexed as the bridge or membrane deflects.

The radioisotope driven power generator of the invention has several significant advantages. A particular advantage is extremely long lifetime operation, if desired. The radioactivity of a radioisotope, or the charges emitted per second, decays exponentially. The half-life of the radioisotope is defined as the time it takes for the activity to become one-half of the original. A rough estimate of the lifetime of a radioisotope power generator of the invention can thus be approximated as the half-life of the radioisotope. If desired, the radioisotope material can be selected to provide a relatively short half-life, in the range of weeks or months, or a long half-life in the range of several years. A particular example of a radioisotope that will provide relatively long life activity at reasonable levels is nickel-63, which has a half-life of 100 years. A second particular advantage is the energy density over the lifetime of the device, which is generally much greater than what can be obtained with conventional batteries. For example, for a nickel-63 source, the calculated energy density is approximately 600 joules/$mm^3$, a value far in excess of the highest density lithium batteries, which have an energy density of about 1 joule/$mm^3$.

The radioisotope micromechanical generator 40 can also be utilized as a sensor in various configurations. As illustrated in the circuit diagram of FIG. 3, the output terminals 55 of the piezoelectric transducer 54 may be connected to a high frequency coil 62 which can function as a radio broadcast coil. The combination of the source 49 and the absorber 50 can be represented as a switch 63 which closes to provide a short across the terminals 57 when the absorber 50 contacts the source 49. A sensing resistor 64 can be connected across the terminals 57, and a reset switch 65 (e.g., an MOS transistor as shown) can be connected in parallel with the resistor 64. The resistor 64 can comprise, for example, a piezoresistive element that changes resistance with stress experienced by the piezoresistor. The reset switch 65 can be closed to discharge any charge accumulated on the absorber 50 and the source 49, beginning a new cycle. The rate of charging of the absorber 50 and the source 49, to the point where the absorber 50 contacts the source 49 to close the effective switch 63, will be determined by the resistance of the resistor 64. Thus, by measuring the period of the series of pulses, each of which occurs as the effective switch 63 is closed, leading to impulse excitation of the LC tank circuit formed by the piezoelectric element 54 and the coil 62, the relative value of the resistor 64 can be determined, thereby determining the value of the quantity (e.g., stress, temperature, etc.) to which the resistance of the resistor 64 is related. The switch 65 may be utilized for such purposes as remote polling of the sensor circuit. For example, the gate of the MOS transistor 65 may be connected to a radio frequency detector which receives a signal from a remote transmitter to turn on the switch 65 and thereby reset the device.

Figure 3:
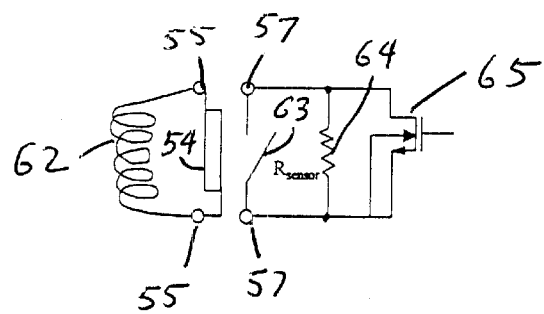
FIG. 3 is a schematic circuit diagram of an exemplary circuit incorporating the micromechanical power generator of FIGS. 1 and 2.
Figure 4:
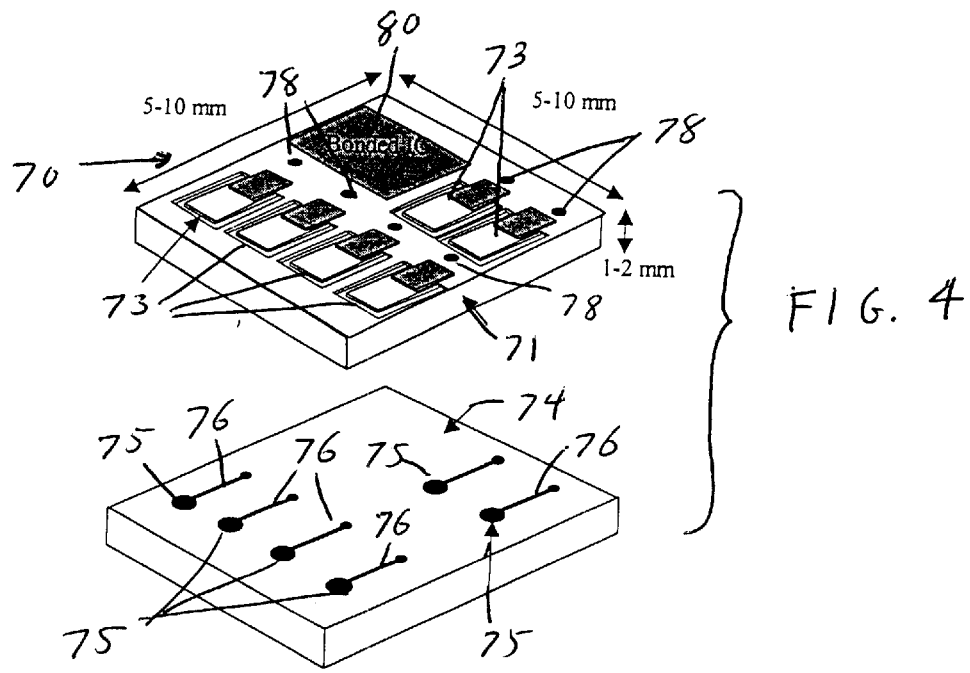
FIG. 4 is an illustrative view showing assembly of an array of vibration sensors onto a base.
Figure 5:
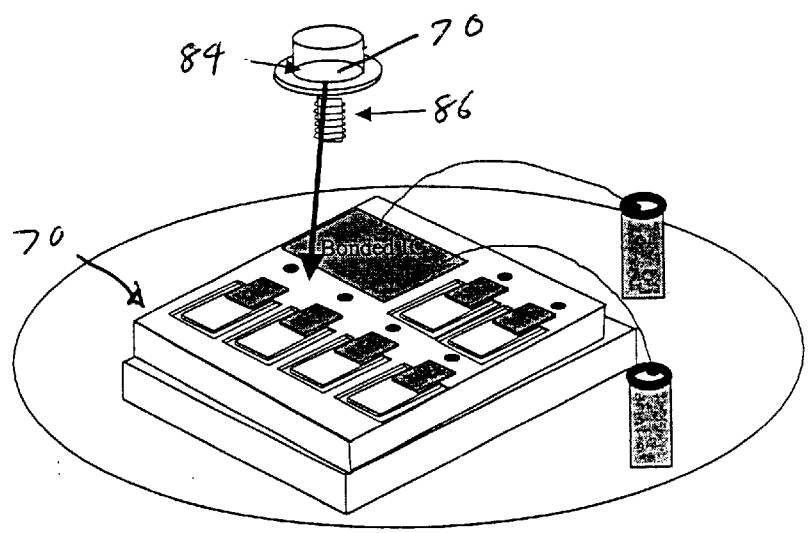
FIG. 5 is a view of the structure of FIG. 4 in assembled form.

The present invention may be readily integrated with other micromechanical and microelectrical components to provide integrated sensing systems. An example of such a device is shown in FIGS. 4 and 5 at 70 wherein a substrate plate 71 has a series of radioisotope micromechanical generators 73 formed thereon, each of which may include a generator such as the generator 40 of FIGS. 1 and 2 incorporated in a circuit such as shown in FIG. 3 with an integrated piezoresistor. The device 70 may be formed with a bottom substrate base 74 (e.g., of glass) on which are formed radioisotope sources 75 with metallic interconnect lines 76 which extends to vias 78 in the substrate 71. The signals at the connectors passing through the vias 78 may be connected to an integrated circuit 80 which is bonded to the substrate base 71. The device 70 may be mounted in a vacuum sealed container 84, as illustrated schematically in FIG. 5, and connected to a radio frequency coil 86 to allow radio transmissions of the quantities sensed by the device 70.

A variety of radioisotopes may be utilized as the radioactive material for the source in the present invention. Examples of various candidate materials are given in Table 1 below:

TABLE 1

| Beta Source | Specific activity (grams/mCurie) | ½ Life | Beta energy (keV) |
|---|---|---|---|
| Nickel-63 | $1.8*10^{-5}$ | 100 years | 66 |
| Ruthenium-106 | $3.03*10^{-7}$ | 1.06 years | 400 |
| Phophorus-32 | $3.5*10^{-9}$ | 14.3 days | 1710 |
| Phophorus-33 | $6.4*10^{-9}$ | 25 days | 250 |
| Sulphur-35 | $2.4*10^{-8}$ | 87.2 days | 167 |
| Calcium-45 | $5.6*10^{-8}$ | 162 days | 256 |
| Tritium | $1.03*10^{-7}$ | 12.3 years | 18.6 |

The incident charged particles can result in secondary electron emission from atoms of the collector. This is because the electrons of the surface atoms can be stripped by the electrostatic interaction between the incident charged particle and the atom-bound electrons. The released electrons can reduce the efficiency of charge collection because the secondary electrons can cause a current flowing back towards the ejector, reducing the overall charging current. In order to reduce the secondary electron current, there are at least three choices: (1) the incident electron energy can be reduced in order to reduce the ability of the particles to ionize the surface atoms. This can be accomplished by placing a layer on top of the source material to absorb much of the energy of the particles before they leave towards the collector. Depositing a controlled layer film of an absorbing material on top of the radioactive source can do this (e.g., gold electroplated on nickel-63); (2) choose a radioactive material that ejects low energy particles, for example tritium; and (3) the secondary electron emission current is related to the atomic number of the collector material. Heavy atoms, having more electrons, produce more secondary electrons. Hence, by choosing a material for the absorber with small number of electrons, the secondary electron emission can be reduced. One such material is carbon, which can be placed in thin film form or machined using conventional machining.

Figure 6:
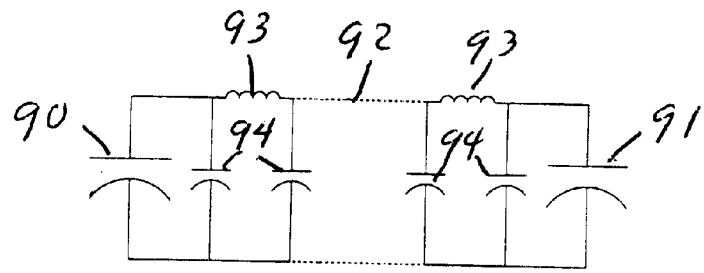
FIG. 6 is an equivalent circuit for the micromechanical power generator connected to a distributed inductive and capacitive load.
Figure 7:
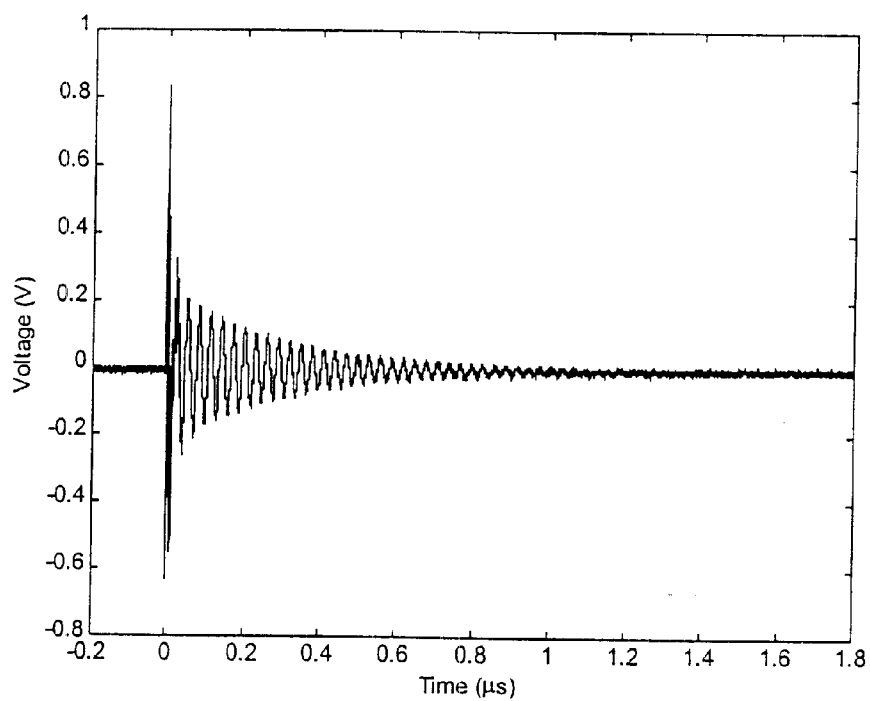
FIG. 7 is a graph showing output voltage as a function of time for a micromechanical power generator as in FIGS. 1 and 2 connected to a small inductive and capacitive load as shown in FIG. 6.

As shown in the circuit diagram of FIG. 6, the equivalent circuit of a piezoelectric transducer may be represented as a capacitor 90 which is connected to a capacitive load 91 through a transmission line 92 which, for a coaxial cable transmission line may be represented as distributed series inductors 93 and parallel capacitors 94. When the beam to which the transducer 90 is connected is released, the pulse output from the piezoelectric transducer results in a damped resonant signal as shown in FIG. 7. Thus, it is apparent by connecting a measurand sensitive circuit element to the piezoelectric transducer, it is possible to change the characteristics of the transmitted signal. For example, an inductor which is sensitive to pressure could be connected to the piezoelectric transducer 90, resulting in an output signal the frequency of which is a function of the inductance of the inductor. The frequency of the decaying resonant signal can be selected to be in the radio broadcast range so that the signal can be picked up by an appropriate radio receiver. As an alternative, the energy stored in the piezoelectric transducer can be used to drive a diode to allow optical communication.

An exemplary fabrication process for forming a sensor device in accordance with the invention which includes polysilicon piezoresistors to measure the bending of the cantilever beam is shown with respect to FIGS. 8–16. The first step as shown in FIG. 8 is the deposit on a crystalline silicon substrate 100 of $Si_3N_4$ layers 101 and 102 by a low pressure chemical vapor deposition (LPCVD) process, followed, as shown in FIG. 9, by the deposit of polysilicon layers 103 and 104 by an LPCVD process. A section of the polysilicon layer 103 is then masked and reactive ion etching (RIE) is carried out to remove the polysilicon except in a region 106 which had been covered by the mask, as shown in FIG. 11. A chemical vapor deposition process is then utilized to deposit a layer 107 of $SiO_2$ onto the section 106 as shown in FIG. 10, followed by RIE etching of the $Si_3N_4$ layers 101 and 102 as shown in FIG. 12. A contact region 110 in the layer 107 is then opened to provide a contact to the polysilicon, as shown in FIG. 13, and metal contact layers 112 and 113 are then deposited as shown in FIG. 14. TMAH etching of the silicon substrate 100 to form a cantilever section 114 is then carried out as shown in FIG. 15, followed by the bonding of a PZT plate 116 to the metal layer 112 as shown in FIG. 16. The polysilicon resistor section 106, as accessed by the contacts 113, allows the bending of the cantilever section to be measured. Appropriately cut PZT plates are bonded to the metal 112. The PZT plates can be soldered, for example, on a Ti/Pt/Au electroplated Au pad on top of a low temperature CVD oxide on top of the buried strain gauges in the silicon cantilever 114. Other alternative bonding methods may be utilized as desired, for example, by the use of Au/Si eutectic binding between a polished PZT plate and an exposed silicon region in the silicon substrate. Generally, with such bonding, the PZT plate needs to be repoled due to depoling during the high temperature eutectic bonding. The silicon collector area is preferably micromachined to be either a flat area or can be formed to have microtips such as those utilized in scanning tunneling microscopes. The CVD oxide will coat such silicon tips. After the low temperature oxide coating, selective shadow-mask evaporation of Ti/Pt/Au can be evaporated only onto the collector region.

Various metals can be utilized as the absorber 50 and can be deposited conveniently on a silicon cantilever. For example, thick gold layers can be electroplated to thicknesses of 15 microns in approximately 30 minutes. Alloys of nickel and tungsten have a higher atomic number that may require thinner collector films. Various different metal films may be fabricated as appropriate to obtain appropriate secondary electron emission, tunneling, and surface stability under radioactive particle impingement.

A shown in FIG. 17, the assembled device, as fabricated as shown in FIGS. 8–16, may be bonded to a base 120 (e.g., of glass) which is bonded to the silicon substrate 100 by, for example, an Au/Si eutectic bond 121. The radioactive source 122 is formed on the base 120 beneath an absorber 124 formed on the free end of the cantilever beam 114. As illustrated in FIG. 17, the piezoresistors 106 are preferably connected together in a Wheatstone-bridge type circuit. The output voltage from the piezoelectric transducer 116 is provided on output lines 126 to a rectifier 127 which provides the rectified output voltage to a storage capacitor 128. The DC voltage stored on the capacitor 128 can be made available to power electronic circuits at output terminals 129. The rectifier 127 may comprise either half-wave or full-wave rectifier bridges utilizing low power diodes, preferably connected to a high quality surface mount ceramic capacitor 128. Such a structure may be utilized to obtain output voltages at the terminals 129 of 1.5 volts, or higher, such that sub-threshold operating capital CMOS logic can be driven.

A first example of the fabrication of a base plate with a radioactive source thereon is illustrated with respect to FIGS. 18 and 19. As illustrated in FIG. 18, the base 120 (e.g., Corning 7740 glass) may have a nickel-63 source formed thereon by first evaporating a plating base 131 of metal (Au/Pt/Ti) followed by electroplating of a layer 132 of Ni-63. As shown in FIG. 17, the glass plate 120 may then be etched to leave an island 133 under the source 132 which can allow the spacing between the top surface of the source 132 and the facing surface of the absorber 124 to be adjusted to a selected gap distance.

Another process for forming a source on a silicon wafer is illustrated with respect to FIGS. 20–24. In this process, silicon dioxide layers 135 and 136 are grown on a crystalline silicon substrate 137 (FIG. 20), the $SiO_2$ layer 135 is masked and etched to form a depression 139 (FIG. 21), the layers of the $SiO_2$ are removed and LPCVD deposited $Si_3N_4$ layers 141 and 142 are deposited (FIG. 22), followed by masking and backside etching to form an etched depression 144 which terminates at the $Si_3N_4$ layer 141 (FIG. 23), followed by metallization of the membrane 141 and depositing by electroplating a source 143 of Ni-63. The depth of the well in which the source 143 is deposited can be adjusted to obtain a desired initial gap between the source and the absorber. An electroless Ni-63 etch bath can be used to electroplate radioactive nickel 143, for example, on a plating base of Ti/Pt/Au which can be shadow mask deposited in the low-stress silicon nitride region 141. An advantage of a source as shown in FIG. 24 is that electrons will be ejected both from the front and the back of the source. The structure of FIG. 24 can then be bonded to a silicon cantilever structure as described above utilizing Au—Si eutectic bonding, e.g., utilizing a shadow masked gold film on the silicon nitride and a collector wafer with exposed silicon treated at a temperature of e.g., 360° C. Such high temperature bonding preferably is performed in a vacuum chamber with a gas scrubber due to the risk of nickel desorption. Another method of bonding that may be utilized is to bond the base and the cantilever structure using heated gold wiring by passing high-current through the wires for in-situ Au—Si bonding, thereby minimizing the temperature treatment to the radioactive nickel absorber.

Commercially available radioactive Ni-63 is in a hydrochloric acid solution with a pH of 1.0. This solution cannot be used directly for plating, since the pH is not in the required range. Two methods are available to use such a solution for radioactive plating. A weak base can be added to a certain amount of the Ni-63 solution to bring the pH into the required range. For example, ammonium hydroxide can be used because it produces a soluble precipitate and will not affect the plating quality. The manner of plating can be selected and controlled in various ways. For example, the deposition rate can be varied by selecting the temperature of the bath, with the optimal temperature in the range of 80°–90° C. A higher temperature would result in the evaporation of the water bath at a rate faster than the rate of deposition of nickel. Also, the amount of the liquid radioactive source can be varied to vary the pH and the activity of the plated piece can be adjusted according to the power needs of the final device. The thickness of the plating deposited in a given length of time depends on the relation of the area of the surface of the metal object being plated to the total volume of the plating bath composition. Surface morphology can also be controlled by the deposition pH.

The final devices may be assembled and placed inside a vacuum or hermetically sealed package, with wire bonding used to connect the sensor and with power contacts from the device to contact pins. The packaging is preferably done in a vacuum environment, for example, by pulling a high vacuum on a small brass pipe, which can be clamped shut after reaching a vacuum level.

The micromechanical activators of the present invention can be formed of materials other than crystalline silicon and in utilizing different MEMS processes. An example of a process for forming the devices of metal structure using a LIGA type process is illustrated with respect to FIGS. 25–35. The LIGA process is discussed in, for example, H. Guckel, et al., "On the Application of Deep X-Ray Lithography with Sacrificial Layers to Sensor and Actuator Construction (The Magnetic Micromotor with Power Takeoffs)," Proceedings of Transducers '91, San Francisco, June 1991; and W. Ehrfeld, et. al., "Fabrication of Microstructures Using the LIGA Process," IEEE Microrobots and Teleoperators Workshop, Hyannis, Mass., 1987. These steps include the initial LPCVD deposit of layers 150 and 151 of $Si_3N_4$ on a substrate 152 such as silicon (FIG. 25) followed by PECVD deposition of $SiO_2$ layers 154 and 155 (FIG. 26), the deposit of metal layers 158 and 159 for a plating base (FIG. 27), spin depositing of a photoresist 160 such as PMMA (FIG. 27), followed by x-ray lithography and development to form open areas 161 in the photoresist which bottom on the plating bases 157 and 158 (FIG. 29), followed by electroplating of non-radioactive Ni-63 in regions 164 and 165 (FIG. 30). Another layer 167 of a photoresist 167 such as PMMA is then spun on (FIG. 31), followed by x-ray lithography and development to open an area 168 bottoming on the plating base 159 (FIG. 32), electroplating of radioactive Ni-63 in a region 170 (FIG. 33), stripping of the photoresist to expose the electroplated metal (FIG. 34), and further etching of the $SiO_2$ sacrificial layer 134 to release the components 164 and 165 from the substrate (FIG. 35). The structures 164 and 165 may form two tines of a tuning fork to allow measurement of the self-reciprocating frequency of the tuning fork powered by the radioactive Ni-63 post 170 as a function of temperature, ambient gases, source material, source strength, initial gap and cantilever dimensions.

Another alternative for power generation using the self-reciprocating cantilever is to use electromagnetic induction. For example, a magnet may be mounted on the cantilever and the cantilever is then placed inside a coil. Upon the sudden release of the cantilever during electrical contact, the beam motion in the coil will result in a time varying voltage across the coil due to the time varying magnetic field. Alternatively, the cantilever placed in a dc magnetic field will result in a time varying current on a patterned wire placed on the cantilever. Wires can be micromachined on the cantilever and connected to a circuit that utilizes the generated current.

The following is an example of a device constructed utilizing the present invention. A β source made of $^{63}Ni$ is used as the radioisotope source. The half-life of $^{63}Ni$ is 100.2 years. The β particles (electrons) emitted have an average energy 17.3 KeV and maximum energy 66 KeV. The $^{63}Ni$ is electroplated as a 4 mm×4 mm thin film on a 1 mm thick Al plate and the activity is 1 mCi. The cantilever is made of copper with dimensions 5 cm×5 mm×60 $\mu$m. The thickness 60 $\mu$m was chosen to capture most of the electrons as the penetration depth of a 66 KeV electron in copper is about 14 $\mu$m. The cantilever is clamped between two Teflon pieces for electrical insulation. The source is clamped by two glass slides, which are mounted on a Teflon base. The Teflon base is in turn mounted on a linear motion stage used to control the initial distance between the source and the cantilever. The setup is placed inside a vacuum chamber with a glass top. A microscope connected to a CCD camera outside the chamber is used to the monitor the gap between the source and the cantilever.

Figure 36:
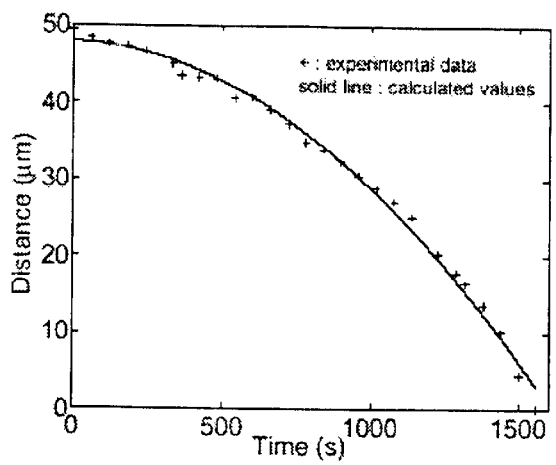
FIG. 36 are graphs of measured and calculated distance versus time for a copper cantilever and a nickel source with an initial gap of 48 $\mu$m.

The results obtained with this structure are illustrated in FIGS. 36–40. FIG. 36 shows the distance versus time for an initial distance of 48 $\mu$m. When the initial distance between the radioisotope and the cantilever is small (<150 $\mu$m), the cantilever is attracted to the source and eventually the two are so close to each other that they lose their charges either by direct contact or possibly by tunneling current.

Figure 37:
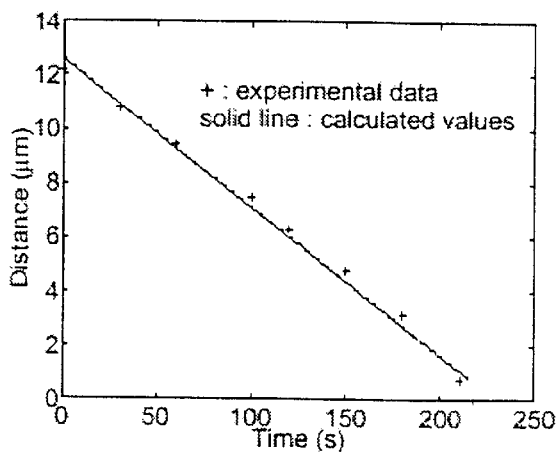
FIG. 37 are graphs of measured and calculated distance versus time for the cantilever as in FIG. 36 with an initial gap of 16 $\mu$m.

The cantilever returns to its initial position and a new cycle begins. The example in FIG. 36 demonstrates a period of 26 minutes. In one experiment, the cantilever has been reciprocating continuously for four weeks. The data were used to extract $C_1$ and $C_2$. Parameters k, A, I were determined from the properties of the materials and the device dimensions. The distance profile predicted by the model is a good fit with the data. FIG. 37 shows d versus t in another experiment with an initial distance 16 $\mu$m, much smaller than 48 $\mu$m. The period is 3 minutes and 38 seconds. The distance seems to be in linear rather than parabolic relationship with the time. With $C_1$ on the order of $10^{-6}$ and $C_2$ on the order of $10^{-3}$ under the experimental conditions, the $t^2$ term of Equation 11 can be neglected when t is small. There is a linear relationship between d and t. A fitting is shown in FIG. 37. Again good agreement is observed. As mentioned before, a nonzero $C_2$ means there are residual charges. If $C_2$ is zeroed, Equation 11 will become $d=d_0-C_1^2t^2$ and a parabola for d versus t is expected. To verify this, the cantilever and the source were manually discharged by shorting them together at the beginning of the reciprocation cycle and the measured d versus t curve became a parabola. The amount of residual charges can be estimated by Equation 14. For the particular case in FIG. 37, $Q_0$ is estimated to be $3.2\times10^{-11}$ Coulombs.

Figure 38:
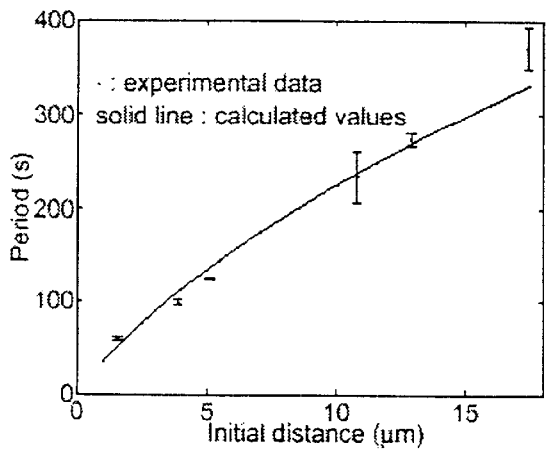
FIG. 38 are graphs of measured and calculated periods for reciprocation of the cantilever as a function of the initial gap.

FIG. 38 shows the measured period as a function of the initial gap along with the calculated results. The fitting was done with a fixed $C_1$ and $C_2$, which is a good approximation as the amount of the residual charges is small. Although the fitting is good, some points do show discrepancy. The mechanism of shorting determines the residual charges after a shorting event. The values of $C_1$ and $C_2$ can be used to investigate the shorting process.

With the model developed, the energy stored in the cantilever and the voltage across the cantilever and the radioisotope can be determined. The data from FIG. 36 will be used as an example. The voltage can be calculated according to Equation 8. V has a maximum $V_m=\sqrt{4kd_0^3/27\epsilon_0 A}$ that can be found by letting $\partial V/\partial t=0$. $V_m$ occurs at $d(t)=d_{Vm}=2d_0/3$. Plugging $d_{Vm}$ into Equation 11 the time when the maximum voltage appears can be determined as:

$$t_{Vm} = \frac{\sqrt{d_0/3} - C_2}{C_1} \quad (16)$$

Figure 39:
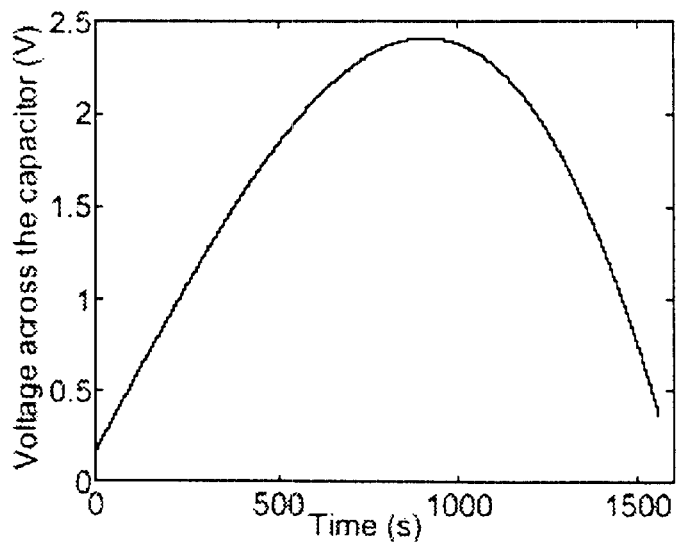
FIG. 39 is a graph of the voltage between the source and absorber for the cantilever as in FIG. 36 with an initial gap of 48 $\mu$m.
Figure 40:
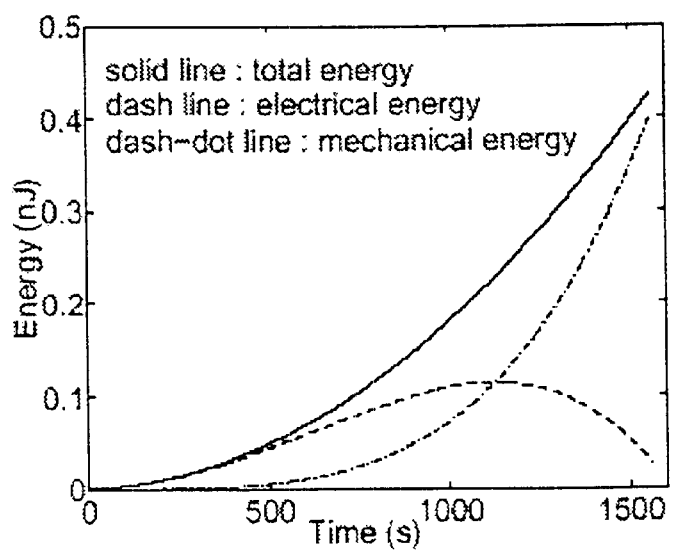
FIG. 40 are graphs of energies stored in a cantilever as in FIG. 36 as a function of time.

The result is shown in FIG. 39 with a maximum voltage 2.4 V at t=912 seconds. The energy stored in the device can be determined by Equation 15 and is shown in FIG. 40. The maximum mechanical energy $E_{maxM}$ is obtained when the cantilever reaches the radioisotope. Hence, $E_{MaxM} = k(d_0 - C_2)^2/2 = 0.45$ nJ for this example. The total energy $E_t$ emitted by the radioisotope can be calculated as:

$$E_t = A_c E_e T \quad (17)$$

where $A_c$ is the activity, $E_e$ is the average energy of the emitted electrons and T is the period. This results in $E_t = 0.16$ mJ. So the efficiency of the cantilever is $2.8 \times 10^{-6}$. Although the efficiency is very low, the cantilever can operate for at least as long as the half-life of the radioisotope, which for $^{63}$Ni is 100.2 years.

It is understood that the invention is not confined to the particular embodiments set forth herein as illustrative, but embraces all such forms thereof as come within the scope of the following claims.

What is claimed is:

1. An activator comprising:
    (a) a base;
    (b) an elastically deformable element having a section spaced from the base that is free to be displaced toward the base from an initial position by elastic deformation of the deformable element;
    (c) an absorber of radioactively emitted particles formed on one of the displaceable section of the deformable element and the base; and
    (d) a material comprising a radioactive source formed on the other of the displaceable section of the deformable element and the base that faces the absorber across a gap, the radioactive source radioactively emitting charged particles, the deformable element capable of displacing in response to accumulated charge on the absorber such that at a sufficient charge the absorber effectively electrically contacts the source to discharge the absorber and allow the deformable element to return elastically to its initial position.

2. The activator of claim 1 wherein the gap is 1 mm or less.

3. The activator of claim 1 wherein the deformable element comprises a cantilever beam mounted at one end to a mounting block mounted to the base to support the cantilever beam above a surface of the base, the absorber or the source formed on the cantilever beam at a free end of the beam.

4. The activator of claim 1 wherein the deformable element comprises an elastically deformable bridge mounted to the base at two opposite ends of the bridge and having a central section that can be displaced toward the base by elastically deforming the bridge, the absorber or the source formed on the central section of the bridge.

5. The activator of claim 1 wherein the deformable element comprises an elastically deformable membrane having a periphery mounted to the substrate with the membrane spaced above a surface of the base, the membrane having a central section that can be displaced toward the base by elastically deforming the membrane, the absorber or the source formed on the central section of the membrane.

6. The activator of claim 1 wherein the deformable element is formed of a material selected from the group consisting of metal and silicon.

7. The activator of claim 1 wherein the absorber is formed of a conducting metal.

8. The activator of claim 1 wherein the material of the source is selected from the group consisting of nickel-63, ruthenium-106, phosphorous-32, phosphorous-33, sulfur-35, calcium-45, and tritium.

9. The activator of claim 1 wherein the material of the source is nickel-63.

10. The activator of claim 1 further including a piezoelectric transducer secured to the deformable element to deform therewith to develop an electrical potential across output terminals of the piezoelectric transducer.

11. The activator of claim 10 further including a coil connected to the output terminals of the piezoelectric transducer to form a resonant tank circuit therewith.

12. The activator of claim 11 including a sensor electrically connected between the absorber and the source, the sensor having an electrical resistance that changes with a sensed quantity to thereby affect the time required to charge the absorber sufficiently to deflect the deformable element sufficiently to contact the absorber to the source.

13. A power generator comprising:
    (a) a base;
    (b) an elastically deformable element having a section spaced from the base that is free to be displaced toward the base from an initial position by elastic deformation of the deformable element;
    (c) an electrical generator coupled to the deformable element for developing an electrical potential across output terminals of the generator as the deformable element returns elastically to its initial position;
    (d) an absorber of radioactively emitted particles formed on one of the displaceable section of the deformable element and the base; and
    (e) a material comprising a radioactive source formed on the other of the displaceable section of the deformable element and the base that faces the absorber across a gap, the radioactive source radioactively emitting charged particles, the deformable element capable of displacing in response to accumulated charge on the absorber such that at a sufficient charge the absorber effectively electrically contacts the source to discharge the absorber and allow the deformable element to return elastically to its initial position.

14. The power generator of claim 13 wherein the electrical generator coupled to the deformable element is a piezoelectric transducer secured to the deformable element to deform therewith.

15. The power generator of claim 13 wherein the deformable element comprises a cantilever beam mounted at one end to a mounting block mounted to the base to support the cantilever beam above a surface of the base, the absorber or the source formed on the cantilever beam at a free end of the beam.

16. The power generator of claim 13 wherein the deformable element comprises an elastically deformable bridge mounted to the base at two opposite ends of the bridge and having a central section that can be displaced toward the base by elastically deforming the bridge, the absorber or the source formed on the central section of the bridge.

17. The power generator of claim 13 wherein the deformable element comprises an elastically deformable membrane having a periphery mounted to the substrate with the membranes spaced above a surface of the base, the membrane having a central section that can be displaced toward the base by elastically deforming the membrane, the absorber or the source formed on the central section of the membrane.

18. The power generator of claim 13 wherein the deformable element is formed of a material selected from the group consisting of metal and silicon.

19. The power generator of claim 13 wherein the absorber is formed of a conducting metal.

20. The power generator of claim 13 wherein the material of the source is selected from the group consisting of nickel-63, ruthenium-106, phosphorous-32, phosphorous-33, sulfur-35, calcium-45, and tritium.

21. The power generator of claim 13 wherein the material of the source is nickel-63.

22. The power generator of claim 14 further including a coil connected to the output terminals of the piezoelectric transducer to form a resonant tank circuit therewith.

23. The power generator of claim 22 including a sensor electrically connected between the absorber and the source, the sensor having an electrical resistance that changes with a sensed quantity to thereby affect the time required to charge the absorber sufficiently to deflect the deformable element sufficiently to effectively electrically contact the absorber and the source.

24. The power generator of claim 13 wherein the electrical generator coupled to the deformable element is a piezoelectric transducer-secured to the deformable element to deform therewith, and including a rectifier connected to terminals of the piezoelectric transducer to rectify the output therefrom to a DC voltage, and a storage capacitor connected to receive the DC voltage from the rectifier.

25. A micromechanical power generator comprising:
 (a) a base;
 (b) an elastically deformable micromechanical cantilever beam mounted at one end to a mounting block mounted to the base to support the cantilever beam above a surface of the base and having a free end that is free to be displaced toward the base from an initial position by elastic deformation of the beam;
 (c) a piezoelectric transducer secured to the cantilever beam to deform therewith to develop an electrical potential across output terminals of the piezoelectric transducer;
 (d) an absorber of radioactively emitted particles formed on one of the free end of the cantilever beam and the base; and
 (e) a material comprising a radioactive source formed on the other of the free end of the cantilever beam and the base facing the absorber across a gap of 1 mm or less, the radioactive source radioactively emitting charged particles, the deformable element capable of displacing in response to accumulated charge on the absorber such that at a sufficient charge the absorber effectively electrically contacts the source to discharge the absorber and allow the cantilever beam to return elastically to its initial position.

26. The micromechanical power generator of claim 25 wherein the cantilever beam is formed of a material selected from the group consisting of metal and silicon.

27. The micromechanical power generator of claim 25 wherein the absorber is formed of a conducting metal.

28. The micromechanical power generator of claim 25 wherein the material of the source is selected from the group consisting of nickel-63, ruthenium-106, phosphorous-32, phosphorous-33, sulfur-35, calcium-45, and tritium.

29. The micromechanical power generator of claim 25 wherein the material of the source is nickel-63.

30. The micromechanical power generator of claim 24 further including a coil connected to the output terminals of the piezoelectric transducer to form a resonant tank circuit therewith.

31. The micromechanical power generator of claim 25 including a sensor electrically connected between the absorber and source, the sensor having an electrical resistance that changes with a sensed quantity to thereby affect the time required to charge the absorber sufficiently to deflect the deformable element sufficiently to contact the absorber to the source.

32. The micromechanical power generator of claim 25 including a rectifier connected to the terminal of the piezoelectric transducer to rectify the output therefrom to a DC voltage, and a storage capacitor connected to receive the DC voltage from the rectifier.

33. A method of generating electrical power suited for use in microelectromechanical systems comprising:
 (a) impinging charged particles emitted from a radioisotope source onto an absorber to draw the absorber and the source toward one another from the electrostatic force from the charge built-up on the absorber, one of the source and absorber formed on an elastically deformable element, the electrostatic force between the absorber and the source elastically deforming the micromechanical element to store mechanical energy in the element, until the absorber is brought into effective electrically conductive contact with the source to discharge the charge accumulated on the absorber and allow the deformable element to elastically return toward an initial position, releasing the mechanical energy stored in the deformable element; and
 (b) transferring energy from the elastically deformable element as it elastically returns toward its initial position to an electrical generator coupled to the deformable element to generate electrical power at output terminals of the electric generator.

34. The method of claim 33 wherein the electrical generator is a piezoelectric transducer secured to the deformable element to deform therewith.

35. The method of claim 34 further comprising rectifying the output electrical power from the piezoelectric transducer and storing the rectified power on a storage capacitor.

36. The method of claim 33 wherein the elastically deformable element is a cantilever beam, and wherein the absorber is formed on a free end of the beam and draws the free end of the beam toward the source until the absorber comes into effective electrically conductive contact with the source.

* * * * *